(12) United States Patent
Hur

(10) Patent No.: US 7,843,522 B2
(45) Date of Patent: Nov. 30, 2010

(54) THIN FILM TRANSISTOR ARRAY PANEL AND METHOD FOR MANUFACTURING THE SAME

(75) Inventor: Myung-Koo Hur, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 604 days.

(21) Appl. No.: 11/480,613

(22) Filed: Jul. 3, 2006

(65) Prior Publication Data

US 2007/0008445 A1    Jan. 11, 2007

(30) Foreign Application Priority Data

Jul. 7, 2005    (KR) .................. 10-2005-0061075

(51) Int. Cl.
*G02F 1/136* (2006.01)
*G02F 1/1343* (2006.01)

(52) U.S. Cl. .................................. 349/46; 349/144
(58) Field of Classification Search ............. 349/46–47, 349/144; 257/72
See application file for complete search history.

(56) References Cited

U.S. PATENT DOCUMENTS

| 6,204,520 | B1 * | 3/2001 | Ha et al. ................. 257/72 |
| 7,112,512 | B2 * | 9/2006 | Lan et al. ................. 438/430 |
| 2004/0174483 | A1 * | 9/2004 | Nakamura et al. .......... 349/139 |
| 2005/0124088 | A1 | 6/2005 | Chen |
| 2005/0140888 | A1 | 6/2005 | Kwon |

* cited by examiner

*Primary Examiner*—Jerry T Rahll
(74) *Attorney, Agent, or Firm*—Innovation Counsel LLP

(57) ABSTRACT

A thin film transistor array panel includes a substrate, a data line and a gate electrode formed on the substrate, a insulating layer formed on the data line and the gate electrode, a semiconductor layer formed on the insulating layer, a drain electrode and a source electrode formed on the semiconductor layer, a passivation layer formed on the drain electrode and the source electrode including a first contact hole to expose a portion of the data line, a second contact hole to expose a portion of the source electrode, a third contact hole to expose a portion of the drain electrode, and a fourth contact hole to expose a portion of gate electrode, a first connector formed on the passivation layer and connected to the data line and the source electrode through the first contact hole and the second contact hole, a gate line formed on the passivation layer and connected to the gate electrode through the fourth contact hole, and a pixel electrode connected to the drain electrode through the third contact hole.

13 Claims, 17 Drawing Sheets

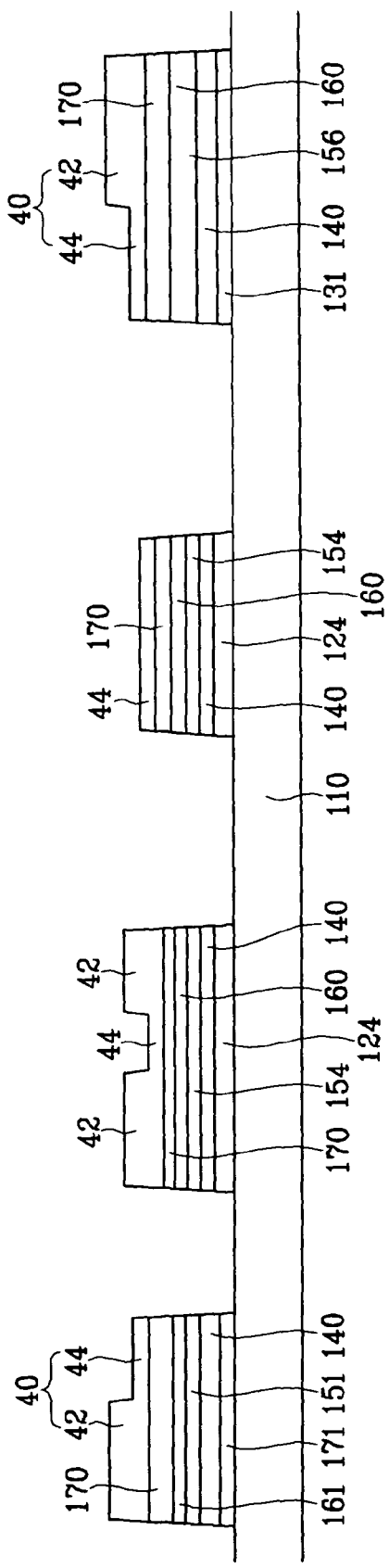

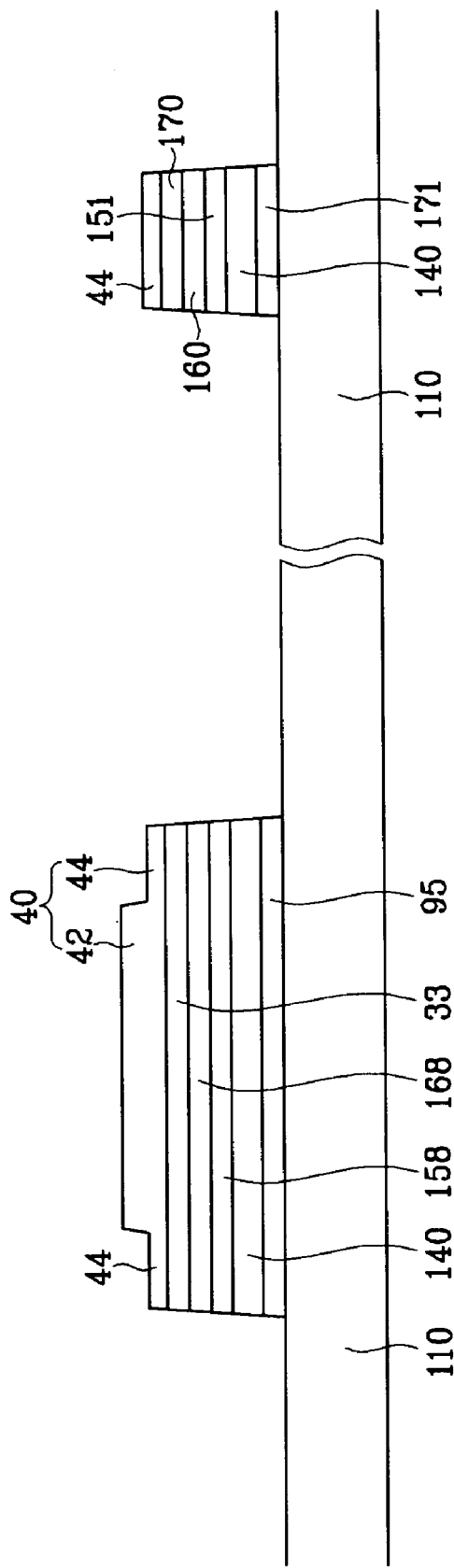

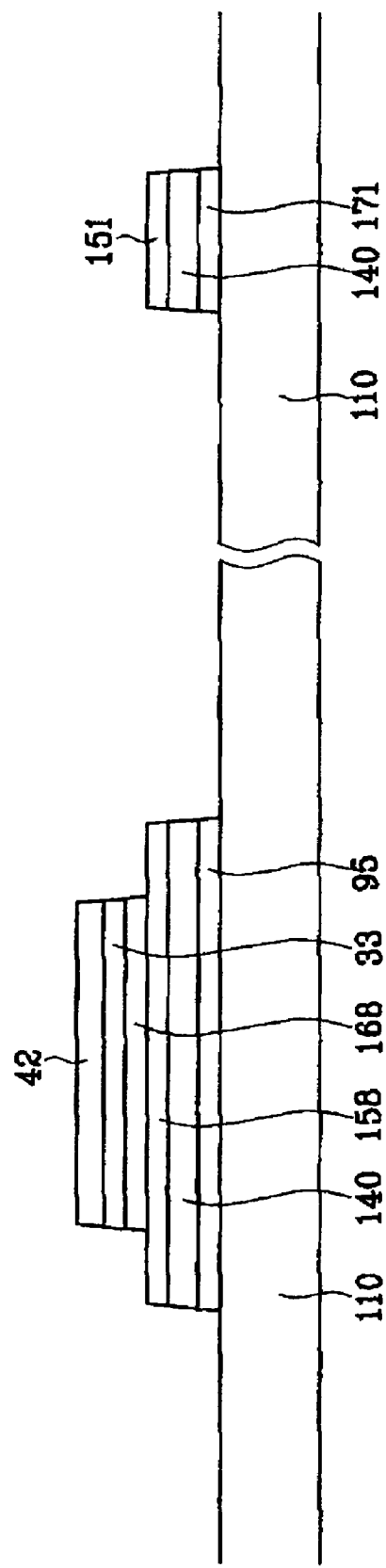

THIN FILM TRANSISTOR ARRAY PANEL AND METHOD FOR MANUFACTURING THE SAME

CROSS-REFERENCE TO RELATED APPLICATION

This application claims priority to Korean Patent Application No. 2005-0061075 filed on Jul. 7, 2005, the disclosure of which is hereby incorporated herein by reference in its entirety for all purposes.

BACKGROUND

1. Field of the Invention

The present invention relates generally to a thin film transistor (TFT) array panel for active matrix display devices such as liquid crystal displays (LCDs) and organic light emitting displays (OLEDs) and a method of fabricating the same.

2. Description of Related Art

Active matrix display devices such as a liquid crystal display (LCD) and an organic light emitting display (OLED) include a plurality of pixels arranged in a matrix. The pixels include a switching element such as a thin film transistor (TFT) having a gate electrode, a source electrode and a drain electrode. The TFT transmits a data signal, which is applied to the source electrode, to a pixel electrode responsive to a gate signal applied to the gate electrode.

The display devices include a thin film transistor array panel, which includes the TFTs, pixel electrodes, and a plurality of signal lines such as gate lines and data lines to transmit signals to the TFTs. The TFT array panel has a multiple layered structure, including thin conductive films and insulating layers.

Conventionally, photolithography and etching steps are used repeatedly to pattern multiple thin film layers to form the TFT array panel. The photolithography steps increase manufacturing cost and time. Therefore, there is a need for reducing the number of photolithography steps.

SUMMARY

The present invention provides a TFT array panel and a method for manufacturing thereof, which may reduce the number of photolithography steps and decrease manufacturing cost. An exemplary TFT array panel according to the present invention includes a substrate, a data line and a gate electrode formed on the substrate; a insulating layer formed on the data line and the gate electrode; a semiconductor layer formed on the insulating layer, a drain electrode and a source electrode formed on the semiconductor layer, a passivation layer formed on the drain electrode and the source electrode and including a first contact hole to expose a portion of the data line, a second contact hole to expose a portion of the source electrode, a third contact hole to expose a portion of the drain electrode, a fourth contact hole to expose a portion of gate electrode, a first connector formed on the passivation layer and connected to the data line and the source electrode through the first contact hole and the second contact hole, a gate line formed on the passivation layer and connected to the gate electrode through the fourth contact hole, and a pixel electrode connected to the drain electrode through the third contact hole.

In other embodiments, the TFT array panel further includes a second connector connected to the gate line and formed of the same layer as the data line and the gate electrode, the passivation layer further comprises a fifth contact hole to expose a portion of the second connector, the gate line is connected to the second connector through the fifth contact hole, the TFT array panel further includes a first light blocking member formed between the passivation layer and the second connector, and the gate line further includes a first portion connected to the fourth contact hole and a second portion connected to the fifth contact hole.

In further embodiments, the TFT array panel further includes a storage electrode line to overlap with the pixel electrode and formed on the same layer as the data line and the gate electrode, the passivation layer further comprises a sixth contact hole configured to expose a portion of the storage electrode line and to connect the gate line to the storage electrode line, and the gate line further comprises a third portion connected to the sixth contact hole.

In yet other embodiments, the TFT array panel further includes a second light blocking member formed on the storage electrode line and formed on the same layer as the source and drain electrodes, the TFT array panel includes a conductive layer formed on the second light blocking member and formed on the same layer as the gate line, the first connector and the gate line have an upper film and a lower film, and the upper film is formed of the same layer as the pixel electrode.

In an exemplary method of manufacturing a TFT array panel according to this present invention, the method includes forming a data line, a gate electrode, a source electrode and a drain electrode on a substrate, forming a passivation layer on the data line, the gate electrode, the source electrode and the drain electrode, forming a first conductive film on the passivation layer, removing a portion of the first conductive film and a portion of the passivation layer to expose a portion of the data line, a portion of the source electrode, a portion of the drain electrode, and a portion of the gate electrode, forming a second conductive film on the first conductive film, an exposed portion of the data line, an exposed portion of the source electrode, an exposed portion of the drain electrode, and an exposed portion of the gate electrode, and removing a portion of the second conductive film and a portion of the first conductive film, thereby forming a pixel electrode, a data line connector and a gate line.

In one embodiment, forming the data line, gate electrode, source electrode and drain electrode on a substrate comprises forming consecutively a third conductive film, an insulating layer, an intrinsic amorphous silicon layer, a doped amorphous silicon layer and a fourth conductive film on the substrate, forming a photoresist on the fourth conductive film with a pattern having a first portion and a second portion thinner than the first portion, removing portions of the fourth conductive film, the doped amorphous silicon layer, the intrinsic amorphous silicon layer, the insulating layer and the third conductive film with the photoresist pattern as a mask, thereby forming the data line, the gate electrode, and a semiconductor, removing the second portion of the photoresist pattern, and removing portions of the fourth conductive film and the doped amorphous silicon layer with the first portion as a mask, thereby forming the source electrode, the drain electrode, and an ohmic contact.

In other embodiments, the photoresist pattern is formed by using a photomask having opaque areas, semi-transparent areas, and transparent areas a storage electrode line is formed, removing the portion of the first conductive film and the portion of the passivation layer comprises exposing a portion of the storage electrode line, a gate line connector is formed, removing the portion of the first conductive film and the portion of the passivation layer comprises exposing a portion of the gate line connector and an end portion of the data line, forming the pixel electrode further comprises forming a contact assistant on the exposed portion of the gate line connector, and forming the pixel electrode further comprises forming a contact assistant on the exposed end portion of the data line.

BRIEF DESCRIPTION OF THE DRAWINGS

The features of the present invention will become more apparent to those of ordinary skill in the art by describing in detail exemplary embodiments thereof with reference to the attached drawings, in which:

FIGS. 5A and 5B are cross-sectional views showing the fabrication steps following the step of FIGS. 4A and 4B respectively;

FIGS. 6A and 6B are cross-sectional views showing the steps following those discussed with reference to FIGS. 5A and 5B respectively;

Use of the same reference symbols in different figures indicates similar or identical items.

DETAILED DESCRIPTION

Figure 1:
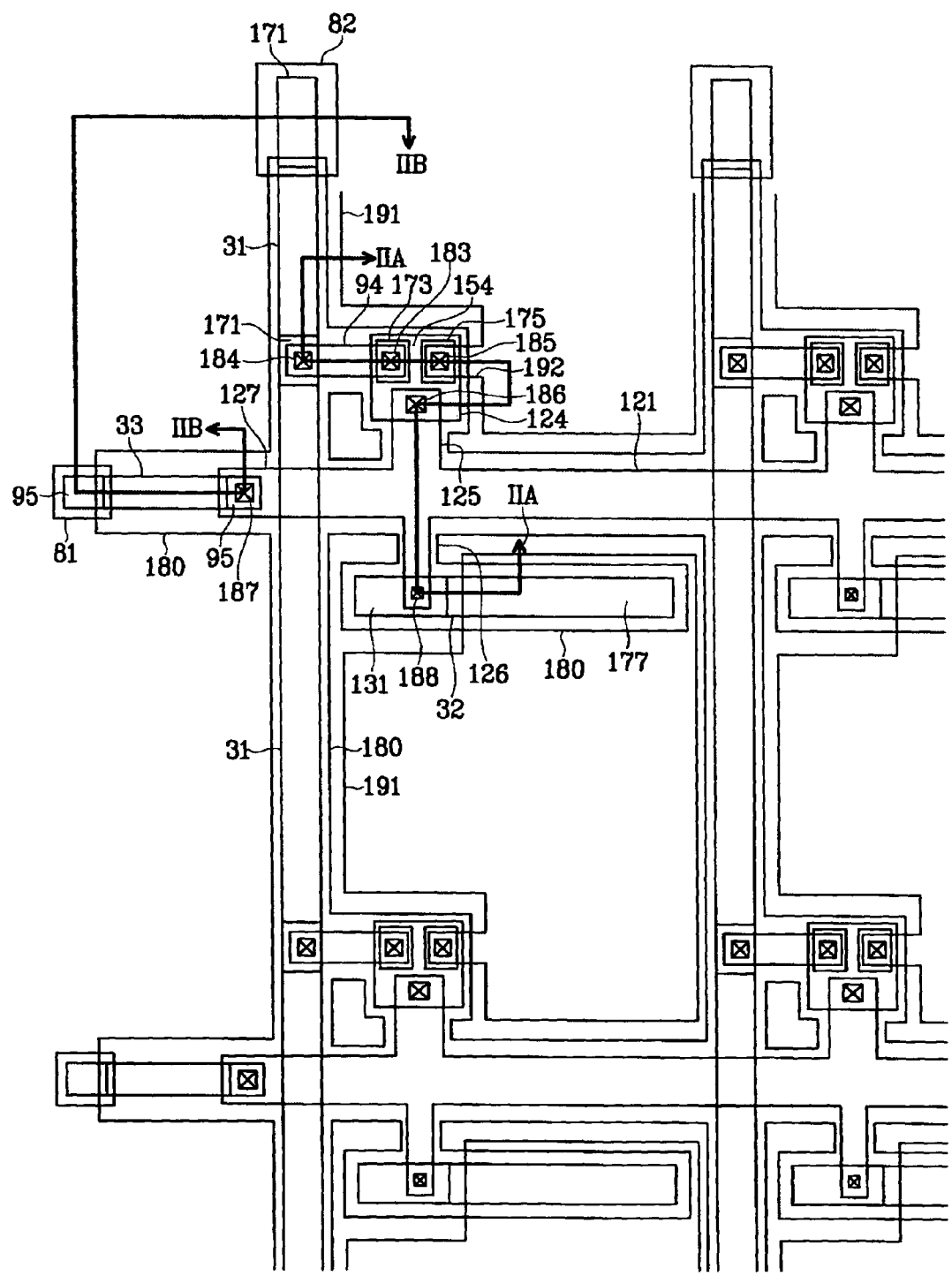
FIG. 1 is a plan view of a TFT array panel according to an embodiment of the present invention.
Figure 2A:
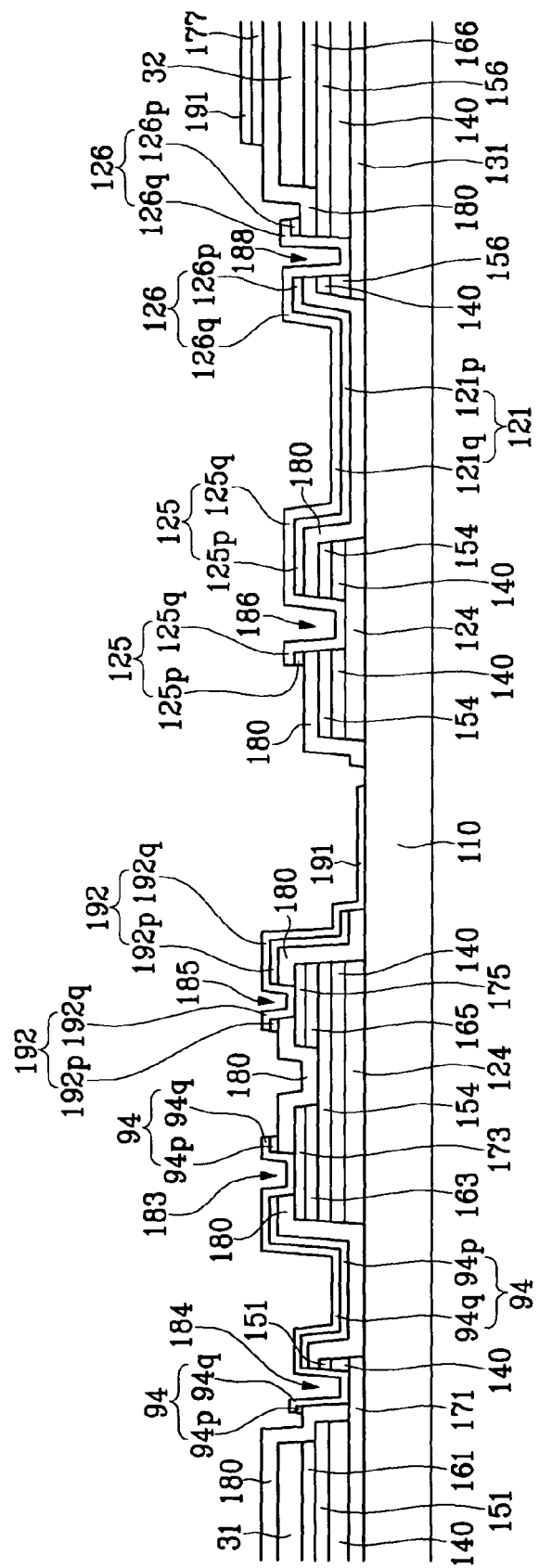
FIGS. 2A and 2B are cross-sectional views taken along the line IIA-IIA and IIB-IIB respectively of the TFT array panel of FIG. 1.
Figure 2B:
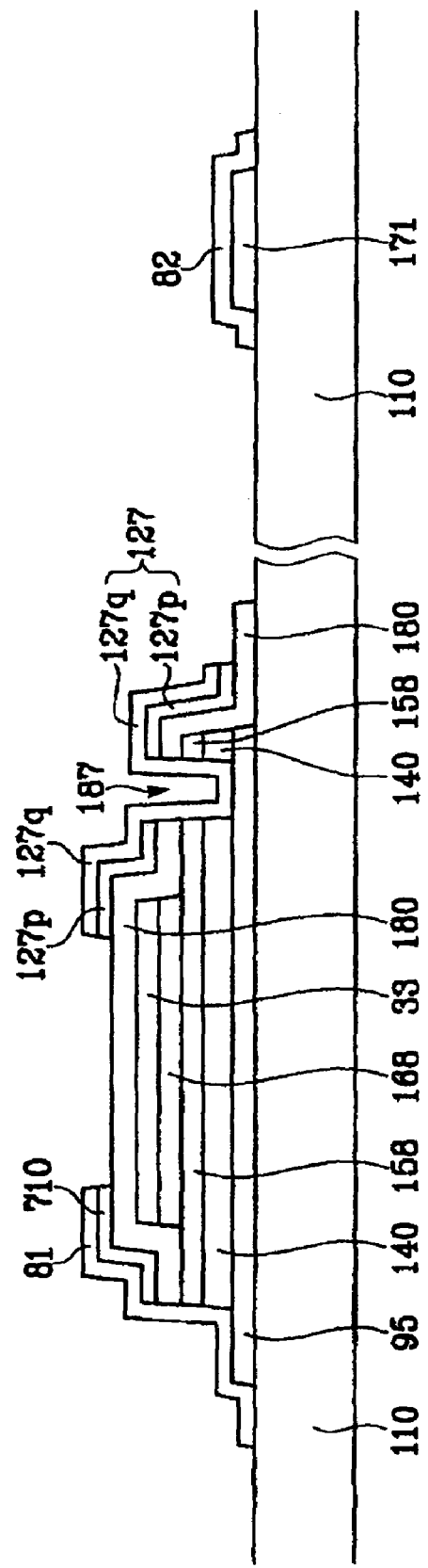

FIG. 1 is a plan view showing a TFT array panel according to an embodiment of the present invention, and FIGS. 2A and 2B are cross-sectional views taken along lines IIA-IIA and IIB-IIB respectively of FIG. 1.

Referring to FIGS. 1 to 2B, data lines 171, gate electrodes 124, gate line connectors 95 and storage electrode lines 131 are formed on an insulating substrate 110 such as a transparent glass or a plastic. Note that as used herein, "on" can be directly on or have intervening elements present.

Data lines 171 transmit data signals and extend in a vertical or longitudinal direction. Each data line 171 may include an end portion having a relatively large area for contact with an external device or an output of a data driving circuit (e.g., formed on, within, or external to substrate 110). Gate electrodes 124 are provided with gate signals and are apart from data lines 171 to form islands, such as of a quadrangular shape.

Gate line connectors 95 are provided with gate signals and extend in a horizontal or transverse direction. Each gate line connector 95 may include an end portion having a relatively large area for contact with another layer, an external device or an output of gate driving circuit (not shown). The gate driving circuit (not shown) can be mounted on a flexible printed circuit or substrate 110 or formed on substrate 110. Gate line connector 95 may connect to gate driving circuit formed on substrate 110.

Storage electrode lines 131 extend in a horizontal or transverse direction and do not cross data lines 171. Each storage electrode line 131 is disposed between and equally apart from adjacent data lines 171. An external voltage, such as a common voltage, is applied to the storage electrode lines 131. Storage electrode lines 131 can be omitted in the case that sufficient storage capacitance exists (e.g., due to overlap of pixel electrodes 190 and gate lines). Also, storage electrode lines 131 can have different arrangements and shapes.

Data line 171, gate electrode 124, gate line connector 95 and storage electrode line 131 can be formed of an Al-based metal such as Al and an Al alloy, a Ag-based metal such as Ag and an Ag alloy, a Cu-based metal such as Cu and a Cu alloy, a Mo-based metal such as Mo and an Mo alloy, Cr, Ta or Ti. Data line 171, gate electrode 124, gate line connector 95 and storage electrode line 131 may have a multi-layered structure including double conductive films having different physical properties. One film may be made of a low resistivity metal, such as an Al-based metal, a Ag-based metal or a Cu based metal for reducing signal delay or voltage drop in data line 171. The other film may be made of a material such as a Mo based metal, Cr, Ta, or Ti which have good physical, chemical, and electrical contact characteristics with other materials such as indium tin oxide (ITO) or indium zinc oxide (IZO). An exemplary combination of the two films is a lower Cr film and an upper Al (alloy) film or a lower Al (alloy) film and an upper Mo (alloy) film. The lower and the upper film materials may be changed relative to each other.

An insulating layer 140 (e.g., made of silicon nitride SiNx or silicon oxide SiOx) is formed on data lines 171, gate electrodes 124, gate line connectors 95 and storage electrode lines 131. A plurality of semiconductor stripes 151 (e.g., made of hydrogenated amorphous silicon (abbreviated to "a-Si") or poly silicon) and a plurality of semiconductor islands 154, 156, and 158 are formed on insulating layer 140. Semiconductor strips 151 are disposed over the associated data lines 171 and extend in a longitudinal direction. Semiconductor islands 154 are disposed over the associated gate electrodes 124. Semiconductor islands 156 are disposed over the associated storage electrode lines 131 and may cover the edges of the storage electrode lines 131. Semiconductor islands 158 are disposed over the associated gate line connectors 95.

A plurality of ohmic contact stripes 161 and ohmic contact islands 163, 165, 166, and 168 (e.g., made of silicide or n+ hydrogenated amorphous silicon highly doped with an n-type impurity such as phosphorous) are formed on semiconductor stripes 151 and semiconductor islands 154, 156, and 158. Ohmic contact islands 163 and 165 are located in pairs on semiconductor islands 154. The lateral sides of semiconductors 151, 154, 156, and 158 and ohmic contacts 161, 163, 165, 166, and 168 form a taper structure and are inclined, e.g., at angles in the range about 30 to 80 degrees relative to the surface of substrate 110.

Source electrodes 173, drain electrodes 175, light blocking member stripes 31 and light blocking member islands 32 and 33 are formed on ohmic contacts 161, 163, 165, 166, and 168. Each source electrode 173 is apart from the associated data line 171 and overlaps at least a portion of the associated gate electrode 124. Each drain electrode 175 is also apart from the associated data line 171 and overlaps at least a portion of the associated gate electrode 124. Each pair of source electrodes 173 and drain electrodes 175 is separated from and facing each other with respect to gate electrode 124.

Light blocking member stripes 31 are disposed over data lines 171 except over areas where data lines 171 are connected to source electrodes 173. Light blocking member islands 32 and 33 are disposed over storage electrode lines 131 and gate line connectors 95 except over the area where storage electrode lines 131 and gate line connectors 95 are connected to different layers or external driving circuits. Light blocking members 31, 32, and 33 are made of opaque conductive film and function to prevent light from entering underlying semiconductors 151, 156, and 158.

A gate electrode 124, a source electrode 173, and a drain electrode 175, along with semiconductor island 154, form a TFT. A channel of the TFT is formed in semiconductor island 154 between source electrode 173 and drain electrode 175.

Source electrode 171, drain electrode 175 and light blocking members 31, 32, and 33 may be formed of a refractory metal such as Mo, Cr, Ta, Ti, and alloys thereof and may have a single or a multi layered structure with a refractory metal film and a low resistivity film. In an exemplary embodiment, a two-layered structure includes a lower layer of Cr, Mo, or alloys and an upper layer of Al or Al alloys. A three-layered structure may have a lower layer of Mo or Mo alloys, an intermediated layer of Al or Al alloys and an upper layer of Mo or Mo alloys.

Source electrodes 173, drain electrodes 175, and light blocking members 31, 32, and 33 form a taper structure and are inclined, e.g., at angles in the range about 30 to 80 degrees relative to the surface of substrate 110. Ohmic contacts 161, 166, and 168 are disposed between the underlying semiconductors 151, 156, and 158 and the overlying light blocking members 31, 32, and 33. Ohmic contacts 163 and 165 are disposed between underlying semiconductor 154 and overlying source electrode 173 and between underlying semiconductor 154 and overlying drain electrode 175 to reduce resistances therebetween.

A passivation layer 180 is formed on light blocking members 31, 32, and 33, source electrodes 173, drain electrodes 175, exposed portions of semiconductors 151, 154, 156, and 158, and exposed substrate 110. In one embodiment, passivation layer 180 may be made of a photosensitive organic material having a good flatness characteristic, photosensitivity, and/or an insulating material having 4.0 or less dielectric constant, or an inorganic material such as silicon nitride and silicon oxide. Also, passivation layer 180 can have a double layered structure including a lower inorganic film to protect semiconductors 151, 154, 156, and 158 from damage caused by following steps and an upper organic film for flatness. Lower films 121p of gate lines 121, lower films 94p of data line connectors 94, lower films 192p of pixel branching portions 192, and storage capacitor conductors 177 are formed on passivation layer 180. Gate lines 121 transmit gate signals and extend in a transverse direction. Each gate line 121 includes connectors 125, 126, and 127 branching toward gate electrode 124, storage electrode line 131, and gate lines connector 95, respectively.

Data line connectors 94 extend between data lines 171 and source electrodes 173 in a transverse direction and overlap at least a portion of data lines 171 and source electrodes 173. Lower films 121p, 192p, and 94p and storage capacitor conductor 177 can be made of a low resistivity material, such as an Al-based metal, an Ag-based metal, or a Cu-based metal, to reduce signal delay or voltage drop.

Referring to FIGS. 2A and 2B, the lower film of connectors 125, 126, and 127 of gate lines 121 is represented by a "p" after numerical references and upper films are represented by a "q". Lower film 94p of data line connectors 94 and passivation layer 180 have a plurality of contact holes 183 to expose a portion of source electrodes 173. Also, lower film 192p and passivation layer 180 have a plurality of contact holes 185 to expose drain electrodes 175. Lower film 94p of data line connectors 94, passivation layer 180, and insulating layer 140 have a plurality of contact holes 184 to expose portions of data lines 171 in order to connect data lines 171 to source electrodes 173. Lower film 121p of gate lines 121, passivation layer 180 and insulating layer 140 have a plurality of contact holes 186, 188, and 187 to expose portions of gate electrodes 124, storage electrode lines 131, and gate line connectors 95, respectively. Passivation 180 and insulating layer 140 are removed in areas corresponding to an end portion of data lines 171 and an end portion of gate line connectors 95, respectively.

Upper film 121q of gate lines 121, upper film 94q of data line connectors 94, upper film 192q of branching portions 192, pixel electrodes 191, and contact assistants 81 and 82 are formed on the exposed portions of substrate 110, gate electrodes 124, data lines 171, source electrodes 173, storage electrode lines 131, passivation layer 180, lower film 94p of data lines connectors 94, lower film 121p of gate lines 121, lower film 192p of branching portions 192, and storage capacitor conductors 177. Pixel electrodes 191 include branching portions 192 extending toward drain electrodes 175.

Upper film 121q of gate lines 121, upper film 94q of data line connectors 94, pixel electrodes 191, upper film 192q of branching portion 192, and contact assistants 81 and 82 are made of a transparent conductive material such as ITO or IZO or a reflective conductor such as Al, Ag, Cr, or alloys thereof.

Upper films 125q, 126q, and 127q of connectors 125, 126, and 127 of gate lines 121 completely cover contact holes 186, 188, and 187, respectively. Upper films 127q of connectors 127 are connected to gate lines connectors 95 through contact holes 187. Upper film 127q and lower film 127p of connectors 127 are provided with gate signals from gate line connectors 95. Upper films 125q and 126q of connectors 125 and 126 are connected to gate electrodes 124 and storage electrode lines 131 through contact holes 186 and 188, respectively. Connectors 125 and 126 carry gate signals to gate electrodes 124 and storage electrode lines 131, respectively.

Upper films 94q of data line connectors 94 completely cover contact holes 184 and 183 to connect data lines 171 and source electrodes 173. Data line connectors 94 carry data signals from data lines 171 to source electrodes 173.

Upper films 192q of branching portions 192 of pixel electrodes 191 completely cover contact holes 185. Pixel electrodes 191 are connected to drain electrodes 175 through contact holes 185, which allows pixel electrodes 191 to receive data voltages from drain electrodes 175.

The pixel electrode 191 provided with the data voltage and the other panel (not shown) having a common electrode provided with a common voltage generate an electric field in LC layer (not shown) disposed between the pixel electrode 191 and the common electrode to orient the LC molecules. The pixel electrode 191 and the common electrode (not shown) form an LC capacitor (or liquid crystal capacitor), which stores applied voltages after the TFT turns off.

A storage capacitor is formed in parallel to the LC capacitor to enhance the capability of storing electrical charges by the LC capacitor. The storage capacitors are formed by overlapping pixel electrodes 191 with storage electrode lines 131.

Light blocking members 32 and storage capacitor conductors 177 are formed between pixel electrodes 191 and storage electrode lines 131. Thus, additional capacitors are formed between storage electrode lines 131 and light blocking members 32 and between storage capacitor conductors 177 and light blocking members 32 to increase the capacity of the storage capacitor.

Contact assistants 81 and 82 are formed on the end portions of gate line connectors 95 and the end portions of the data lines 171, respectively, and overlap portions of passivation layer 180. Contact assistants 81 and 82 protect the end portions of gate line connectors 95 and data lines 171 and enhance adhesion between the end portions and external devices. A metal layer 710 is disposed between passivation layer 180 and contact assistants 81 and 82. Overlapping of contact assistants 81 and 82 with passivation layer 180 and forming of metal layer 171 are optional.

Hereinafter, a method for fabricating the TFT array panel of FIGS. 1 to 2B will be described in detail by referring to FIGS. 3 to 10B and FIGS. 1 to 2B.

Figure 3:
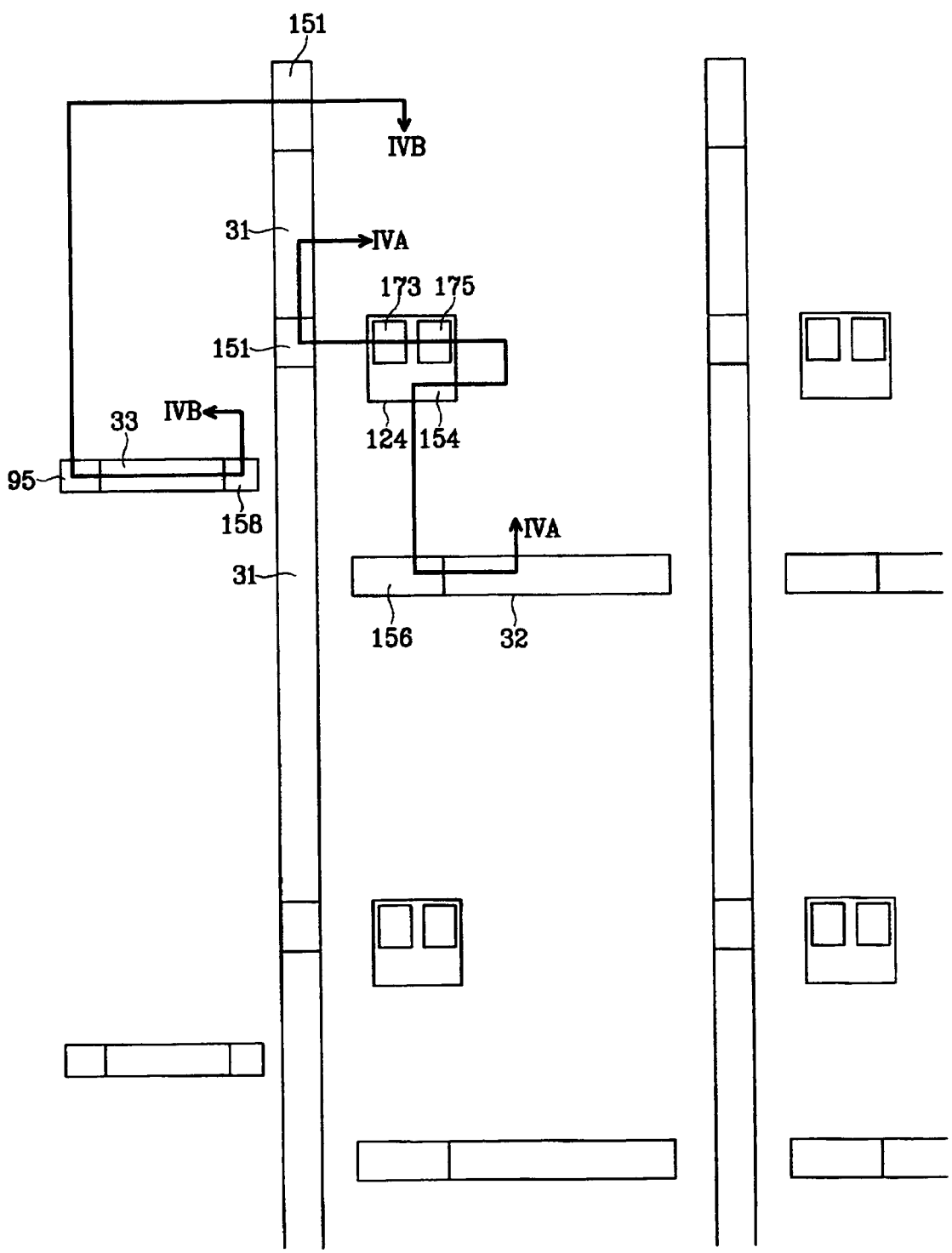
FIG. 3 is a plan view of a TFT array panel at one step of a manufacturing process according to an embodiment of the present invention.
Figure 4A:
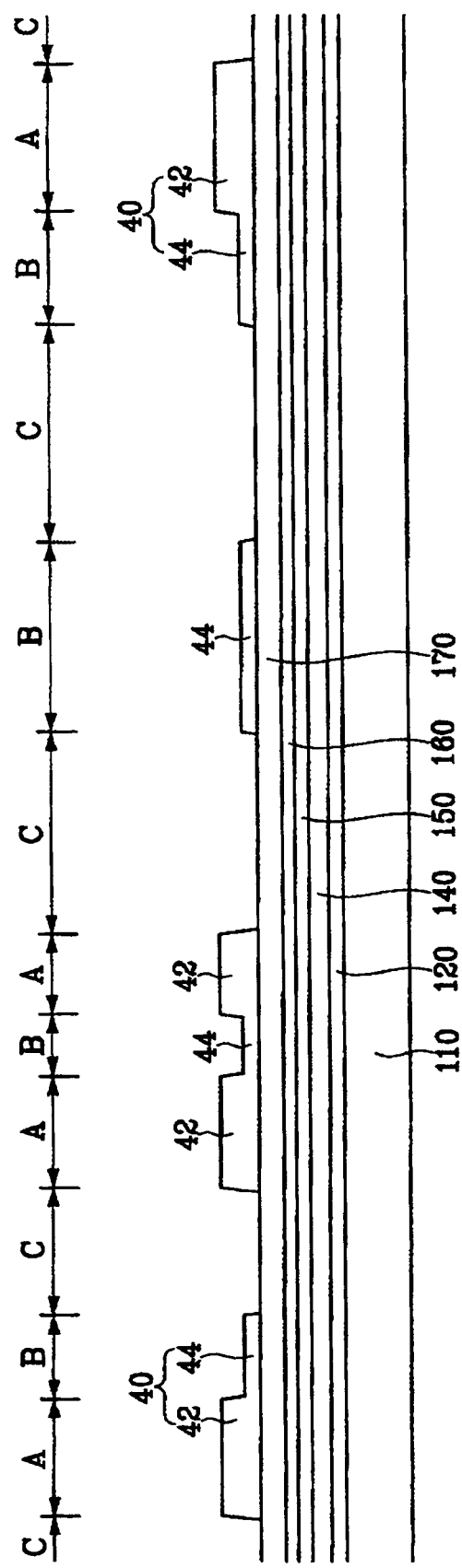
FIGS. 4A and 4B are cross-sectional views taken along the lines IVA-IVA and IVB-IVB respectively of the TFT array panel of FIG. 3.
Figure 4B:
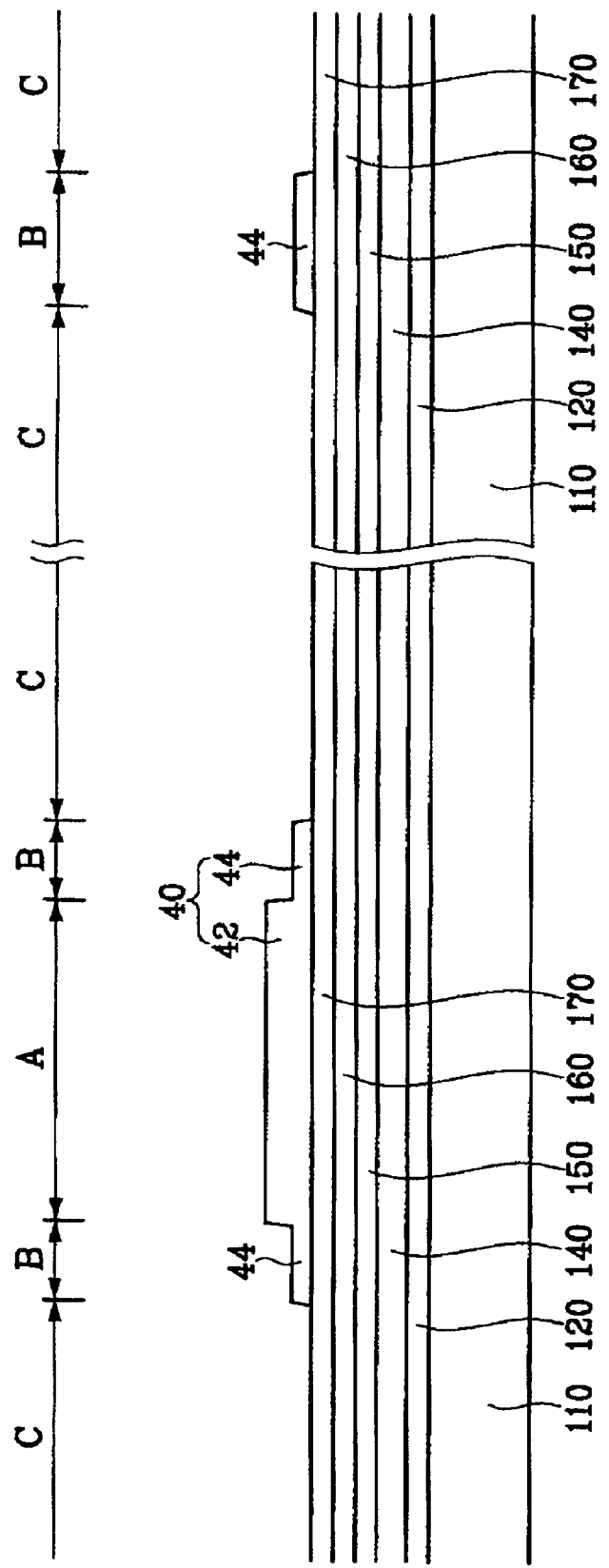

As shown in FIGS. 3 and 4B, a first conductive film 120 made of metal is formed on an insulating substrate 110 such as a transparent glass and plastics (e.g. by sputtering). An insulating layer 140, an intrinsic amorphous silicon layer 150, and a doped amorphous silicon layer (i.e. extrinsic a-Si) 160 are sequentially formed on first conductive film 120 (e.g. by chemical vapor deposition (CVD)). A second conductive film 170 made of metal is formed on doped amorphous silicon layer 160 (e.g. by sputtering). A photoresist film 40 with a thickness of about 1 μm to 2 μm is formed on second conductive film 170. Photoresist 40 may be made of organic material. Photoresist film 40 is patterned by photolithography to form photoresist patterns (i.e., exposure of the photoresist through a photomask to a light and development of the photoresist).

Referring to FIGS. 4A and 4B, photoresist patterns include a plurality of first and second portions 42 and 44 having different thickness (i.e., a thickness of the developed photoresist varies depending upon position). First portions 42 and second portions 44 correspond to wire areas A and channel areas B, respectively. The portions of the photoresist film corresponding the remaining areas C are removed or have a very small thickness (e.g., substantially zero) to expose underlying portions of conductive layer 170. The thickness ratio of second portions 44 to first portions 42 is adjusted depending upon the etching conditions in the subsequent etching steps. In one embodiment, the thickness of second portions 44 is equal to or less than half the thickness of first portions 42, e.g., the thickness of the second portions 44 is less than or equal to 4000 Å.

The position-dependent thickness of the photoresist film is obtained by several techniques, such as, for example, by providing semi-transparent areas corresponding to second portions 44 on the photomask as well as transparent areas and opaque areas. The semi-transparent areas can have a slit or lattice pattern be a thin film(s) with intermediate transmittance or intermediate thickness. When using a slit pattern, it is preferable that the width of the slits or the distance between the slits is smaller than the resolution of a light exposure device used for the photolithography. Another example is to use reflowable photoresist. That is, once a photoresist pattern made of a reflowable material is formed by using a normal photomask having only transparent areas and opaque areas, the photoresist pattern is subject to a reflow process to flow onto areas without the photoresist, thereby forming thin portions.

As shown in FIGS. 5A and 5B, second conductive film 170, doped amorphous silicon layer 160, intrinsic amorphous silicon layer 150, insulating layer 140, and first conductive film 120 are consecutively etched with patterned photoresist film 40 as a mask, thereby forming a plurality of data lines 171, a plurality of gate electrodes 124, a plurality of storage electrode lines 131, a plurality of gate line connectors 95 and a plurality of semiconductors 151, 154, 156, and 158.

Figure 6A:
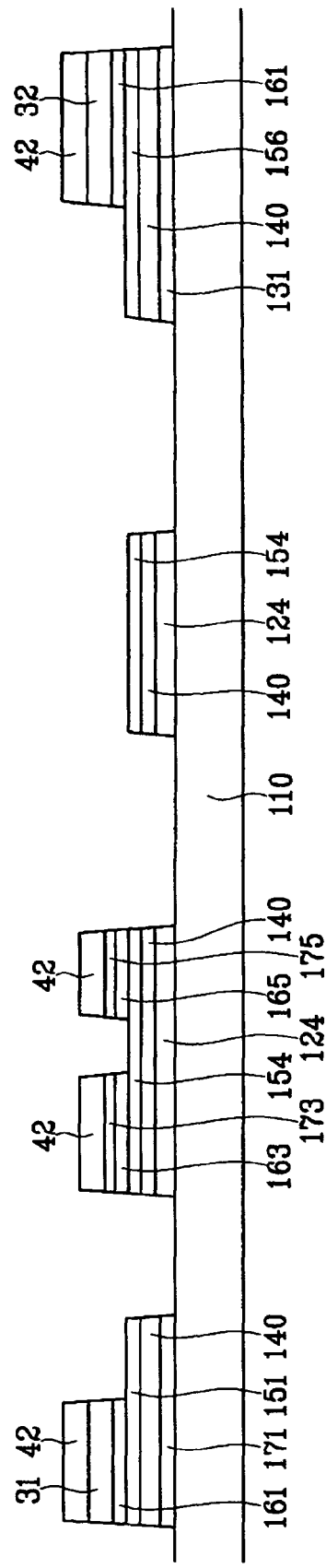

Referring to FIGS. 6A and 6B, second portions 44 are next removed, such as by an ashing process, and the thickness of first portions 42 is reduced. Second conductive film 170 and doped amorphous silicon 160 are removed with remaining first portions 42 as a mask, thereby forming a plurality of light blocking members 31, 32, and 33, a plurality of source electrodes 173 and drain electrodes 175, and a plurality of ohmic contacts 161, 163, 165, 166, and 168. The remaining first portions 42 are then removed, such as by an ashing process.

Figure 7:
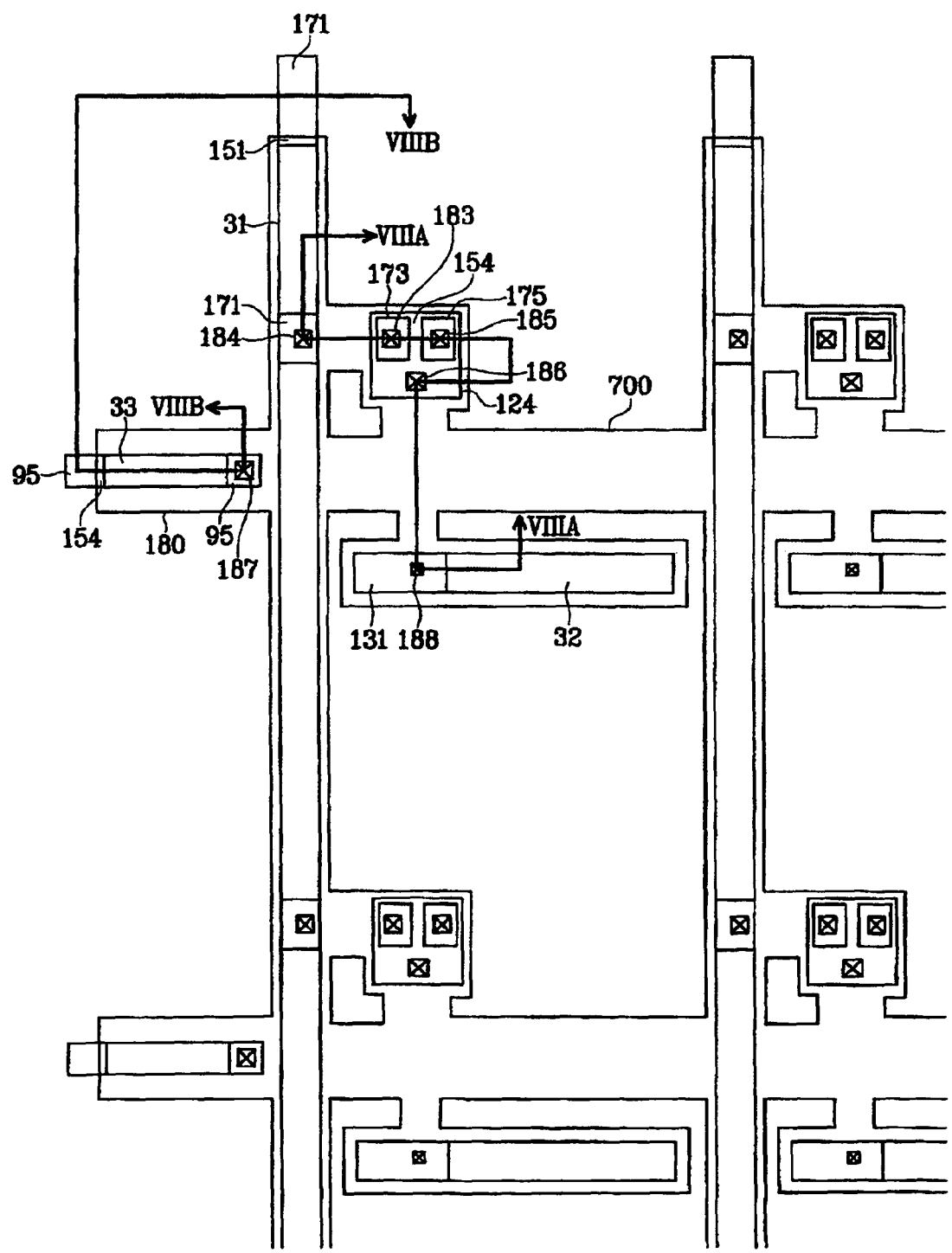
FIG. 7 is a plan view showing another step of fabricating a TFT array panel according to an embodiment of the present invention.
Figure 8A:
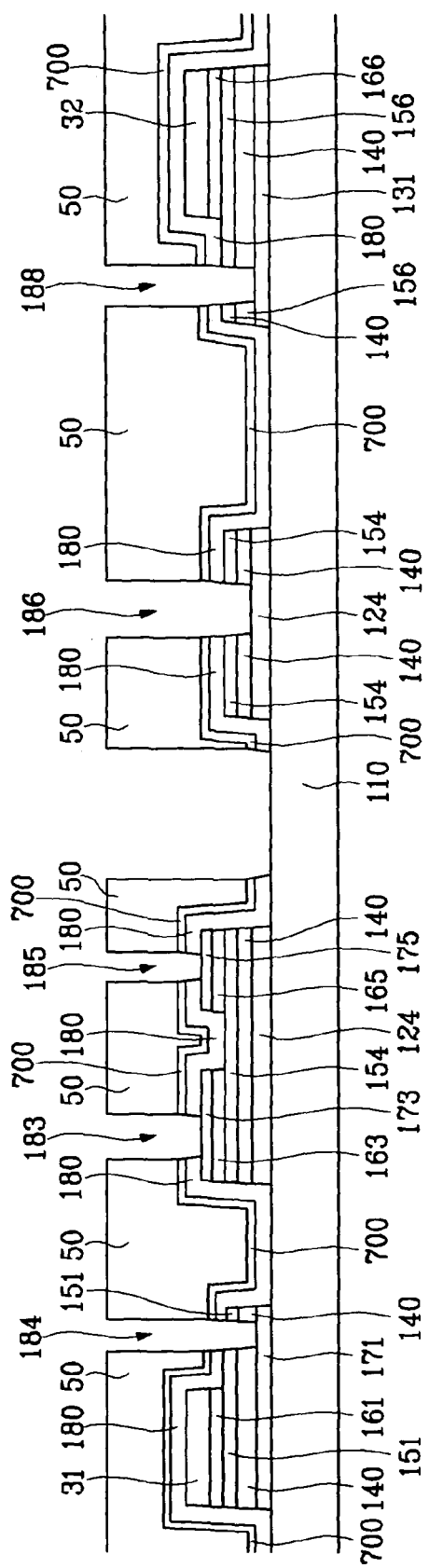
FIGS. 8A and 8B are cross sectional views taken along the lines VIIIA-VIIIA and VIIIB-VIIIB respectively of the TFT array panel of FIG. 7.
Figure 8B:
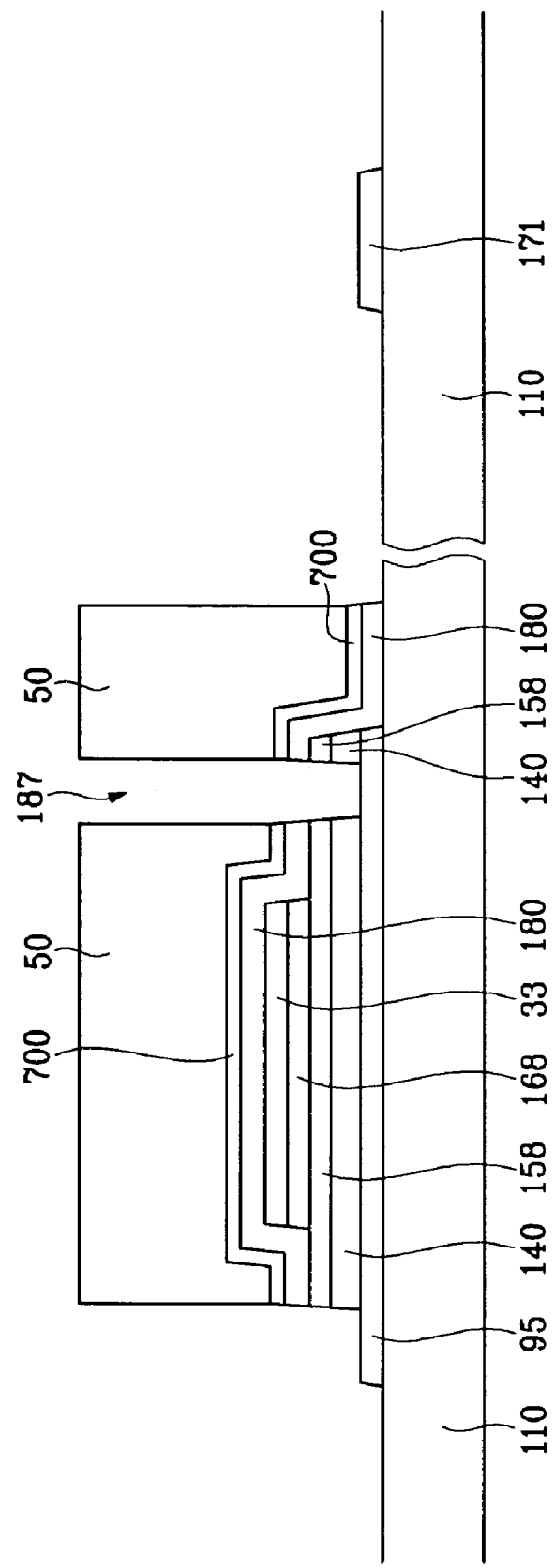

Referring to FIGS. 7 to 8B, a passivation layer 180 is formed on light blocking members 31, 32 and 33, source electrodes 173, drain electrodes 175, exposed portions of semiconductors 151 and 154, and exposed portions of insulating substrate 110. A third conductive film 700 made of metal is subsequently formed on passivation layer 180 (e.g. by sputtering), and a photoresist film 50 is formed on third conductive film 700. Photoresist film 50 is patterned by photolithography to form the desired photoresist pattern (i.e., exposure of the photoresist through a photomask to a light and development of the photoresist).

As shown in FIGS. 7 to 8B, third conductive film 700 and underlying passivation layer 180 are removed with the patterned photoresist film 50 as a mask to form a plurality of contact holes 183, 184, 185, 186, 187, and 188. Portions of source electrodes 173 and drain electrodes 175 are exposed through contact holes 183 and 185, respectively. Portions of data lines 171, portions of gate electrodes 124, the end portions of gate line connectors 95, and portions of storage electrode lines 131 are exposed through contact holes 184, 186, 187, and 188, respectively. Also, portions of third conductive film 700 and underlying passivation layer 180 are removed to expose other end portions of gate line connectors 95 and data lines 171. The patterned photoresist film 50 is then removed, such as by an ashing process.

A fourth conductive film (not shown), such as ITO or IZO, is formed by sputtering on the patterned third conductive film 700, exposed portions of data lines 171, exposed portions of gate electrodes 124, exposed portions of storage electrode lines 131, exposed portions of gate line connectors 95, exposed portions of source electrodes 173 and drain electrodes 175, and exposed portions of insulating substrate 110. IDIXO (indium x-metal oxide) (made by ldemitsu Co. of Japan) can be used as an IZO target for sputtering. In one embodiment, an IZO target includes indium oxide ($In_2O_3$) and zinc oxide (ZnO), with the amount of zinc content in the indium and zinc is about 15 to 20 atomic %. A temperature for sputtering IZO is 250° C. or less to minimize a contact resistance with other conductive layer.

Figure 9A:
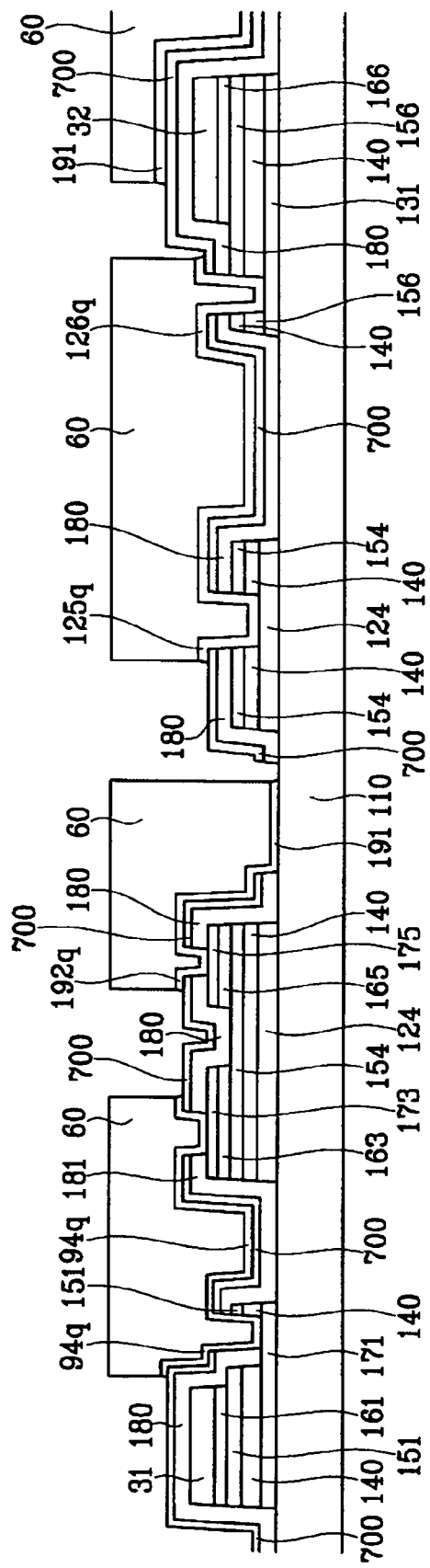
FIGS. 9A and 9B are cross sectional views showing the steps following those discussed with reference to FIGS. 8A and 8B respectively.
Figure 9B:
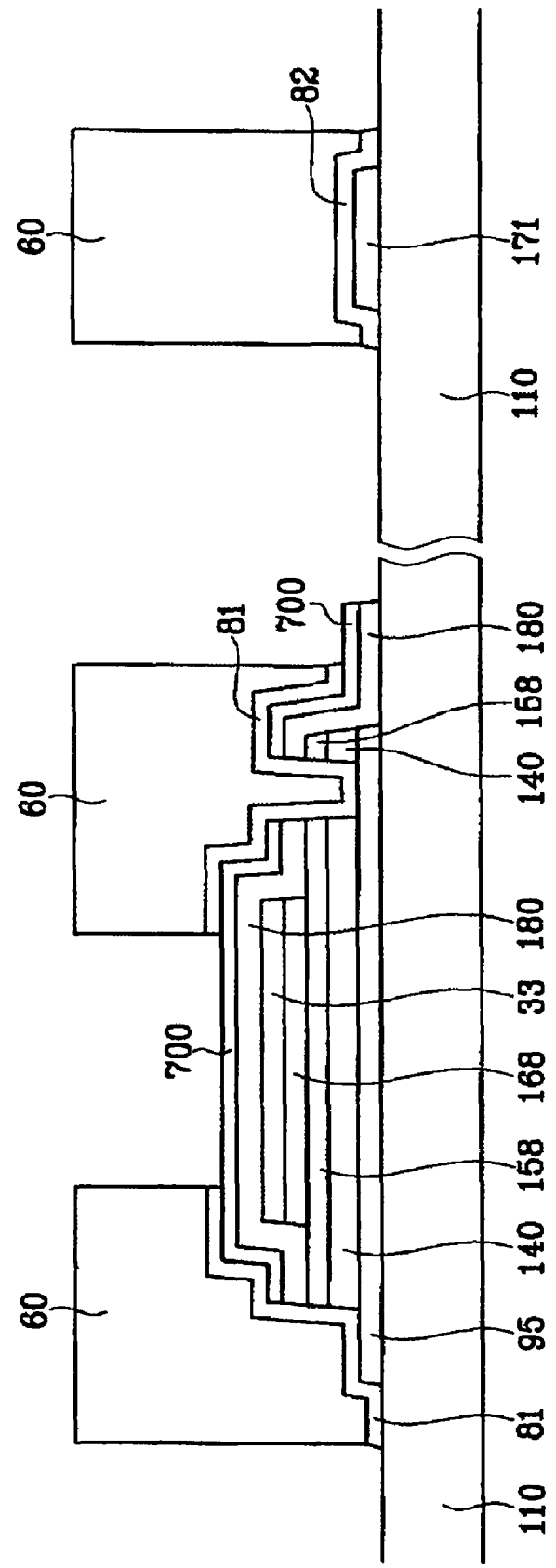

As shown in FIGS. 9A and 9B, a photoresist film 60 is patterned by photolithography to form a desired photoresist pattern. Fourth conductive film (not shown) is consecutively removed with the patterned photoresist 60 as a mask, thereby forming sidewalls of upper films 125q and 126q, upper films 94q, and upper films 192q, pixel electrodes 191, and contact assistants 81 and 82 and exposing portions of third conductive film 700.

Figure 10A:
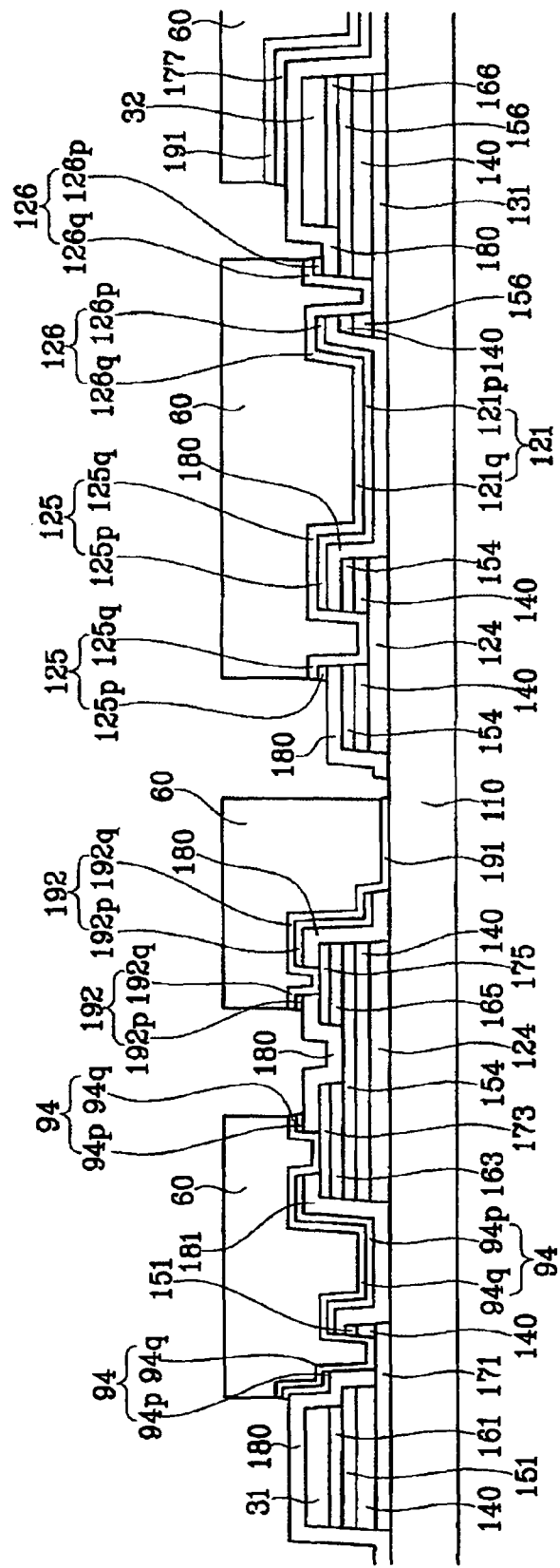
FIGS. 10A and 10B are cross sectional views showing the steps following those discussed with reference to FIGS. 9A and 9B respectively.
Figure 10B:
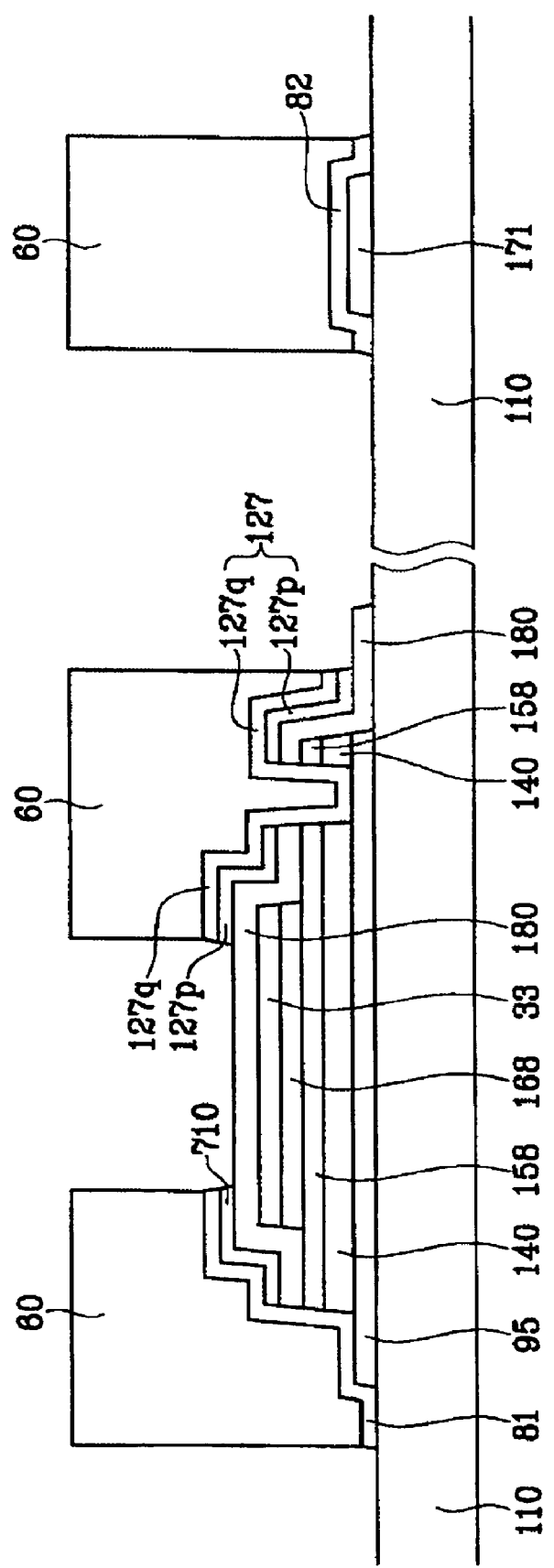

As shown in FIGS. 10A and 10B, the exposed third conductive film 700 is removed again with the patterned photoresist 60 as a mask, thereby forming sidewalls of lower films 125p and 126p, lower films 94p, and lower films 192p, and storage capacitor conductors 177 overlapping with pixel electrodes 191. Meanwhile, a metal layer 710 is formed between contact assistants 81 and 82 and passivation layer 180 in the area corresponding to the end portions of data lines 171 and gate line connectors 95.

According to the above processes, a TFT array panel as shown in FIGS. 1 to 2B is completed.

In this embodiment of the present invention, since data lines 171, drain electrodes 175, source electrodes 173, underlying ohmic contacts 161 and 165, semiconductors 151, and gate electrodes 124 are formed by a single photolithography step and a photolithography step for forming pixel electrodes 191 and contact assistants 81 and 82 is omitted, the photolithography process and manufacturing costs are reduced.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A thin film transistor array panel comprising:
 a substrate;
 a data line and a gate electrode formed above the substrate;
 an insulating layer formed above the data line and the gate electrode;
 a semiconductor layer formed above the insulating layer;
 a drain electrode and a source electrode formed above the semiconductor layer;
 a passivation layer formed above the drain electrode and the source electrode, wherein the passivation layer includes a first contact hole to expose a portion of the data line, a second contact hole to expose a portion of the source electrode, a third contact hole to expose a portion of the drain electrode, and a fourth contact hole to expose a portion of the gate electrode;
 a first connector formed above the passivation layer and connected to the data line and the source electrode through the first and the second contact holes;
 a gate line formed above the passivation layer and connected to the gate electrode through the fourth contact hole; and
 a pixel electrode connected to the drain electrode through the third contact hole.

2. The thin film transistor array panel of claim 1, further comprising a second connector connected to the gate line and formed on the same layer as the data line and the gate electrode.

3. The thin film transistor array panel of claim 2, wherein the passivation layer further comprises a fifth contact hole to expose a portion of the second connector.

4. The thin film transistor array panel of claim 3, wherein the gate line is connected to the second connector through the fifth contact hole.

5. The thin film transistor array panel of claim 4, further comprising a first light blocking member formed between the passivation layer and the second connector.

6. The thin film transistor array panel of claim 5, further comprising a second light blocking member formed on the storage electrode line and formed on the same layer as the source electrode and the drain electrode.

7. The thin film transistor array panel of claim 6, further comprising a conductive layer formed on the second light blocking member and formed on the same layer as the gate line.

8. The thin film transistor array panel of claim 3, wherein the gate line further comprises a first portion connected to the fourth contact hole and a second portion connected to the fifth contact hole.

9. The thin film transistor array panel of claim 1, further comprising a storage electrode line overlapping the pixel electrode and on the same layer as the data line and the gate electrode.

10. The thin film transistor array panel of claim 9, wherein the passivation layer further comprises a sixth contact hole to expose a portion of the storage electrode line and to connect the gate line to the storage electrode line.

11. The thin film transistor array panel of claim 10, wherein the gate line further comprises a third portion connected to the sixth contact hole.

12. The thin film transistor array panel of claim 1, wherein the first connector and the gate line each comprise an upper film and a lower film.

13. The thin film transistor array panel of claim 12, wherein the upper film is formed on the same layer as the pixel electrode.

* * * * *